United States Patent [19]
Ringel et al.

[11] Patent Number: 5,571,339
[45] Date of Patent: Nov. 5, 1996

[54] HYDROGEN PASSIVATED HETEROEPITAXIAL III-V PHOTOVOLTAIC DEVICES GROWN ON LATTICE-MISMATCHED SUBSTRATES, AND PROCESS

[75] Inventors: Steven A. Ringel, Columbus; Richard W. Hoffman, Jr., Bay Village; Basab Chatterjee, Columbus, all of Ohio

[73] Assignees: The Ohio State Univ. Research Found, Columbus; Essential Research Inc., Cleveland, both of Ohio

[21] Appl. No.: 422,850

[22] Filed: Apr. 17, 1995

[51] Int. Cl.$^6$ .............. H01L 31/068; H01L 31/0304; H01L 31/18
[52] U.S. Cl. .............. 136/252; 136/262; 437/5; 437/132; 437/133; 437/248; 437/937; 437/939; 257/431
[58] Field of Search .............. 136/252, 262; 437/2–5, 132–133, 247–248, 937, 939; 257/431

[56] References Cited

U.S. PATENT DOCUMENTS

| | | | |
|---|---|---|---|
| 4,591,654 | 5/1986 | Yamaguchi et al. | 136/252 |
| 4,963,949 | 10/1990 | Wanlass et al. | 257/190 |
| 5,059,551 | 10/1991 | Chevallier et al. | 437/96 |

OTHER PUBLICATIONS

B. Chatterjee et al, Hydrogen Passivation of Dislocations in InP on GaAs Heterostructures, *Appl. Phys. Lett.* 65(1), 4 Jul. 1994, pp. 58–60.
T. A. Gessert et al, *Conference Record, 21st IEEE Photovoltaic Specialists Conf.* (1990), pp. 153–157.
C. E. Dubé et al, *Conference Record, 19th IEEE Photovoltaic Specialists Conf.* (1987), pp. 1516–1517.
C. M. Leboeuf et al, *Conference Record, 20th IEEE Photovoltaic Specialists Conf.* (1988), pp. 644–648.

*Primary Examiner*—Aaron Weisstuch
*Attorney, Agent, or Firm*—Fay, Sharpe, Beall, Fagan, Minnich & McKee

[57] ABSTRACT

A hydrogen passivated photovoltaic device such as a solar cell comprises a lattice mismatched substrate such as Ge or Si, and a hydrogen passivated heteroepitaxial layer such as InP grown on the substrate. The hydrogen passivated heteroepitaxial III-V photovoltaic device is produced by exposing a sample of a heteroepitaxial III-V material grown on a lattice-mismatched substrate to reactive hydrogen species at elevated temperatures. Reactive hydrogen forms bonds with dangling bonds along dislocations defined in the sample. The electrical activity in the dislocations is passivated as a result of the hydrogenation process.

23 Claims, 6 Drawing Sheets

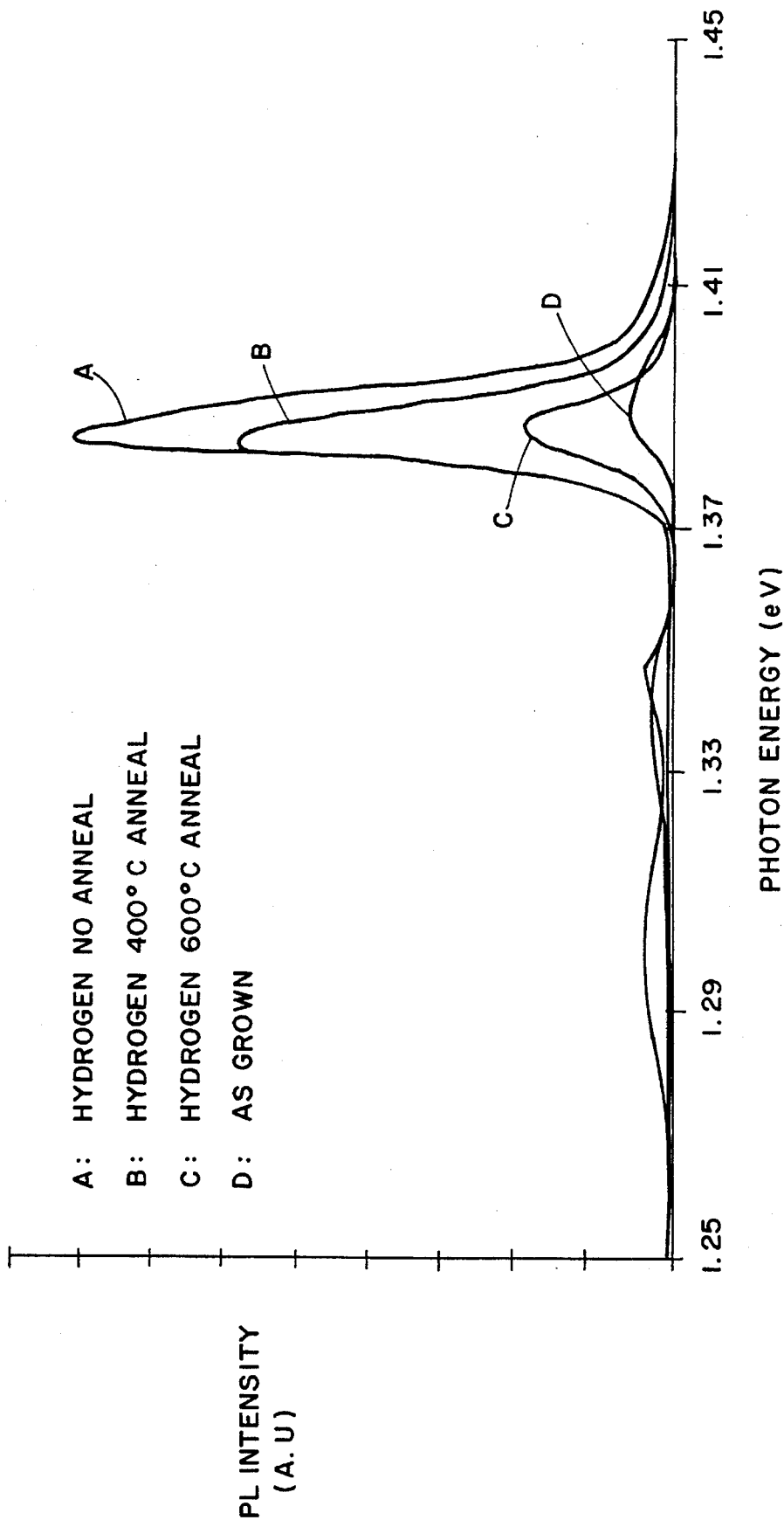

HYDROGEN PASSIVATED HETEROEPITAXIAL III-V PHOTOVOLTAIC DEVICES GROWN ON LATTICE-MISMATCHED SUBSTRATES, AND PROCESS

BACKGROUND OF THE INVENTION

The present invention is directed to hydrogen passivated heteroepitaxial III-V photovoltaic devices grown on lattice-mismatched substrates such as Ge and Si.

The present invention is further directed to the development of a hydrogen passivation process to significantly reduce or eliminate the electrical activity of dislocations in heteroepitaxial III-V materials such as InP grown on group IV substrates such as Ge and Si. This process may be incorporated into a solar cell fabrication process and result in the improved efficiency of such cells. The process may also be useful in the integration of high speed electronic and photonic devices.

Materials such as InP and its permutations grown on substrates such as Si, Ge and GaAs are of particular interest for large area, lightweight and mechanically strong solar cells for space applications. A key problem with these and other existing heteroepitaxial III-V photovoltaic cells is the presence of threading dislocations within the active regions of the cell. The dislocations form as a result of growing the III-V materials on lattice-mismatched substrates. For example, the large lattice mismatch between InP and certain group IV substrate materials (4% for Ge and GaAs, 8% for Si) result in the generation of high densities (on the order of $10^8$ cm$^{-2}$) of threading dislocations within the InP bulk. Such dislocations degrade the electrical properties of the material, causing poor photovoltaic performance of subsequent heteroepitaxial solar cells. Specifically, dislocations can degrade cell characteristics in a number of ways by introducing shunting paths across photovoltaic p-n junctions, by generating recombination centers within the depletion region by generating traps within the quasineutral bulk, and by developing a high concentration of deep levels that can severely reduce minority carrier lifetime.

Prior efforts to reduce or eliminate the negative effects of dislocations in heteroepitaxial III-V solar cells consisted of methods aimed at reducing the total number of dislocations present, rather than addressing the electrical activity of dislocations. These prior techniques include the development of compositionally graded buffer layers, strained layer superlattice buffer layers, thermally cycled growth methods, and others.

These prior techniques have limitations. The magnitude of the lattice mismatch (i.e. the magnitude of the misfit strain in III-V materials grown on Group IV substrates) is large, yet high quality strain-relaxed III-V films over large areas are required for solar cell array feasibility. It is not possible to prevent rampant relaxation over such large areas at the temperatures required for growing these materials by conventional techniques. The net result is that threading dislocation densities will most likely be unable to reach the values necessary to achieve high efficiency cells using the prior techniques alone.

The present invention contemplates a hydrogen passivation process which overcomes the limitations of the prior art techniques. Instead of reducing the number of dislocations, the hydrogen passivation process described herein addresses the electrical activity of the cell dislocations.

BRIEF DESCRIPTION OF THE INVENTION

In accordance with the present invention, there is provided a hydrogen passivated photovoltaic cell, e.g. a solar cell, comprised of heteroepitaxial III-V materials grown on lattice mismatched substrates. The present invention also provides for a hydrogen passivation process for reducing or eliminating the electrical activity in dislocations formed in heteroepitaxial III-V photovoltaic devices grown on lattice mismatched substrates.

A process for treating dislocations in heteroepitaxial materials grown on lattice-mismatched substrates calls for exposing a sample of a heteroepitaxial material grown on a lattice mismatched substrate to a source of reactive hydrogen species, including a hydrogen plasma at an elevated temperature sufficient to cause diffusion of reactive hydrogen species into the heteroepitaxial materials. The reactive hydrogen bonds to dangling or unsatisfied bonds along dislocations defined in the heteroepitaxial material. The electrical activity in the dislocations is reduced or eliminated (i.e. passivated) as a result of the hydrogenation steps.

A hydrogen passivated photovoltaic device such as a solar cell is produced as a result of this process. The photovoltaic device has a lattice mismatched substrate comprising a group IV material like Si or Ge, or another material such as GaAs. A hydrogen-passivated heteroepitaxial layer grown on the lattice mismatched substrate includes or defines dislocations which are electrically passivated as a result of hydrogenation.

The hydrogen passivation process has a number of desirable characteristics and advantages. First, it is very simple and easily implemented in a device fabrication process. Second, it utilizes standard equipment typically available in any reasonable semiconductor fabrication facility. Third, passivation can be performed over large lateral areas that are defined by the geometry of the equipment providing the reactive hydrogen system itself. Fourth, the passivation process really complements and extends the concept of dislocation control to a range that conventional graded buffer layer approaches cannot achieve over large areas and for large lattice mismatch. The resulting hydrogen passivated heteroepitaxial III-V photovoltaic device has a reduced level of undesirable electrical activity emanating from the dislocations as a result of the passivation process. Moreover, dopants may be reactivated without reactivating the dislocations.

BRIEF DESCRIPTION OF THE DRAWINGS

The following figures form a part of the specification and illustrate certain aspects of the invention.

FIG. 6 identifies a variation of photoluminescence intensity for the process conditions shown.

DETAILED DESCRIPTION OF THE PREFERRED EMBODIMENT

The present invention is directed to the development of a post-growth hydrogen passivation process for significant reduction of deleterious electrical activity due to dislocations in heteroepitaxial III-V materials. The process results in high-efficiency heteroepitaxial III-V photovoltaic cells grown on mechanically strong and lightweight substrates (i.e. lightweight in comparison to the III-V materials) such as Si and Ge, or other Group IV materials. The process of the present invention has been optimized to achieve passivation of dislocations using a variety of test structures. The process may be implemented for use in preparing solar cells and other structures.

Figure 1:
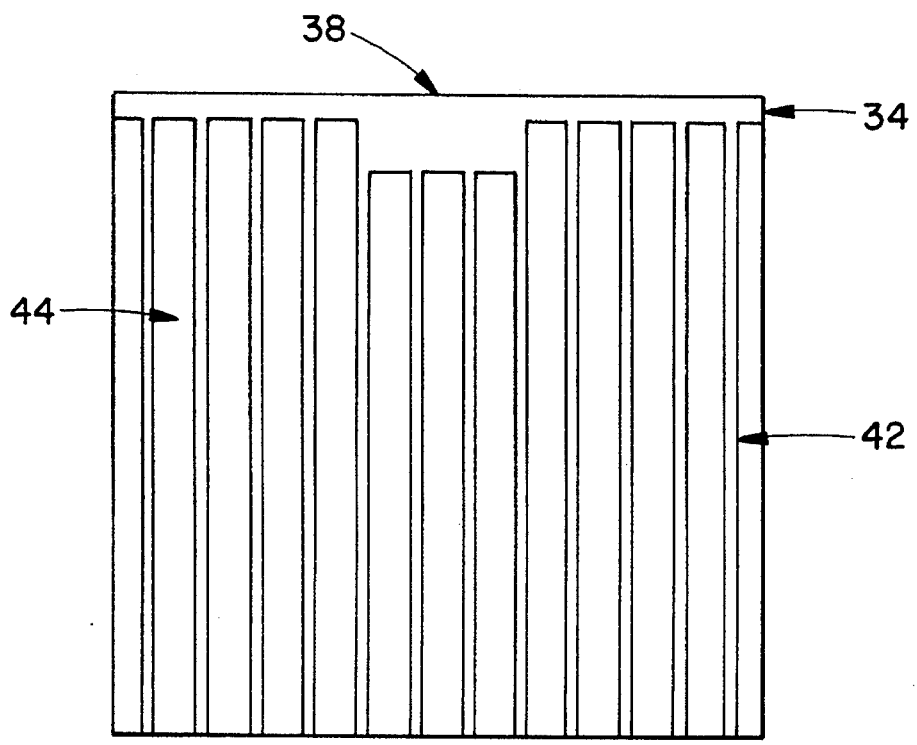
FIG. 1 is a plan view of a hydrogen passivated heteroepitaxial III-V solar cell structure.
Figure 2:
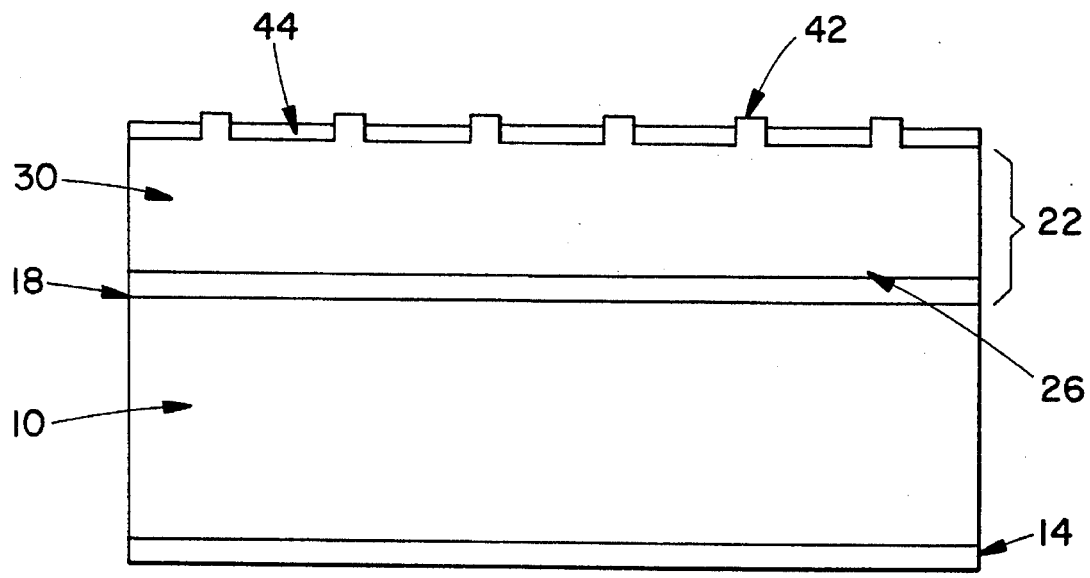
FIG. 2 is a cross sectional view of a hydrogen passivated heteroepitaxial III-V solar cell structure.

A schematic representation of a hydrogen passivated heteroepitaxial III-V solar cell is set forth in FIGS. 1 and 2. The device can be divided into three regions—a bottom region, a central region, and a top region.

The bottom region constitutes the substrate 10 which carries the top layers. The choice of substrate is made based on mechanical and physical properties of strength, weight, thermal expansion coefficient, lattice match, and cost. The consideration of these usually leads to Si or Ge substrate materials for application as space solar cells. In addition to providing support for the top layers, the substrate incorporates a rear or back metal electrical contact 14 to the device.

The central region 18 provides an interconnection to a solar cell at the top. This central region may be nothing more than an interface between the substrate material and the solar cell, an interface between Ge and InP, for example. Additional buffer layers may be employed to facilitate the growth of the heteroepitaxial solar cell material. These buffer layers may be elemental or alloys of group IV, III-V, or Group II-VI. They may also include compositional steps or continuous grading to adjust the lattice parameter to match the substrate at the bottom of this region and to match the solar cell lattice at the top of this region. GaAs or $Ga_xIn_yP$ are used herein. The emphasis is not to eliminate the dislocation defects caused by related heteroepitaxial growth, but rather to provide a suitable surface or interface for the top layer material to be deposited free from defects such as pinholes, cracks, and rough morphology. This region also provides electrical connection to the active electrical device at the top.

The top region is the active electrical device such as a III-V heteroepitaxial solar cell, here an InP solar cell 22. The cell includes a hydrogen passivated zone 26. A p-n junction is shown at 30, a bus bar at 34, and a contact pad at 38. Many high efficiency InP based solar cell devices have been described in the literature. The general design is a relatively thin emitter highly doped with Si, Se, S or Zn, etc. and a lightly doped thick base region. A back surface field may be employed along with other buffer layers since it is known that dislocation defect concentrations decrease with distance from an interface. The specific design of the electrical device, i.e. layer thicknesses and doping, will depend on the application. The application may be to convert light from the sun in space, a terrestrial application or to convert radiant thermal energy in a thermophotovoltaic system employing InGaAs as an active cell material. The cell design may also include monolithically integrated multi-junction devices such as InP or InGaAs for the active regions. The cell design includes the front grid metallization 42 and anti-reflective coatings 44, optimized for the specific design. The hydrogen passivation process is applied to the active region to eliminate the deleterious electrical effects of the dislocation defects which arise from heteroepitaxial growth of the active region.

A feature of the present invention is the combination of fabricating a heteroepitaxial device, free from morphological defects such as pinholes, cracks, and surface roughness, knowing that dislocation defects will exist in the crystalline material and repairing the electrical defect of the dislocations by hydrogen passivation.

Hydrogen passivation is accomplished by exposing a sample, chip, or wafer consisting of a III-V heteroepitaxial layer of photovoltaic cell structure grown on a lattice-mismatched substrate, to a plasma of hydrogen in a standard rf plasma reactor at an elevated temperature sufficient to cause diffusion of reactive hydrogen ions into the III-V material. The mobile reactive hydrogen species preferentially bonds to charged defects such as dangling bonds along a dislocation core, other extended defects resulting from lattice strain relaxation, or point defects. This bonding by hydrogen species alters the electrical properties of the particular defect. Depending upon the type of defect, hydrogen will directly deactivate the electrical activity of the defect or form a complex that compensates the electrical activity of the defect. For the case of dislocations, the mechanism is not yet known and is under investigation. However, it is likely that hydrogen simply satisfies (bonds to) dangling bonds along the dislocation cores. The thermal stability of this hydrogen-dislocation complex is critical for the successful application of this process since the passivation must withstand additional cell processing steps such as metal contact formation and deposition of anti-reflection coatings. Fortunately, the strain fields associated with dislocations and other extended defects will aid in "trapping" hydrogen, and this process exhibits a high degree of thermal stability with no measurable electrical reactivation of dislocations up to anneal temperatures equal to or greater than 550° C.

The general procedure to achieve such passivation calls for providing a sample comprising a heteroepitaxial group III-V material grown on a group IV lattice mismatched substrate. The group III-V material is grown on the substrate according to metallo-organic chemical vapor deposition (MOCVD), chemical vapor deposition (CVD), or other methods. The sample is cleaned in standard organic solvents such as acetone and methanol, and de-ionized water, and dried in nitrogen prior to loading into a plasma reactor. A thin layer of hydrogen-permeable silicon nitride of thickness typically ranging from about 10 to 100 nanometers is deposited over the entire surface of the heteroepitaxial group III-V layer. The nitride layer protects the heteroepitaxial III-V surface from subsequent plasma damage and prevents vaporization of the group V component during the subsequent hydrogen exposure. After nitride deposition, the substrate temperature is raised to an optimum temperature ranging from about 100° C. to 300° C. and exposed to a hydrogen plasma for a duration ranging from 10 min. to 3 hours that depends on the passivation depth desired. Hydrogen pressure is in the range of 100 to 500 mTorr, and a plasma power density ranging from 0.05 to 0.1 Watts per $cm^2$. These conditions apply when a 30kHz plasma reactor is used and will vary for other types of systems used to introduce hydrogen. Each of the steps takes place in a single plasma chamber, hence no exposure to air occurs. Hydrogenation is performed in a plasma reactor such as the Technics Planar Etch II 30kHz parallel plate plasma reactor, a 13.56MHz reactor, or an electron cyclotron resonance (ECR) reactor. Parameters will vary depending on the reactor used.

In hydrogen passivation of heteroepitaxial p-type InP layers of about 2 microns in thickness, it has been determined that optimum conditions include a substrate temperature of about 250° C. a duration in the plasma chamber of 2 hours, total hydrogen pressure of 500 mTorr, plasma power density of 0.08 Watts/cm$^2$, using the 30kHz plasma reactor described above. Similar conditions, except significantly shorter exposure times in the range of about 0.5 to 1 hour are expected when a 13.56Mhz reactor is used.

After passivation, the sample is cooled to room temperature in a nitrogen purge and removed from the chamber. The sample is then annealed at temperatures ranging from 370° to 410°, or about 380° C. in the case of InP, for a duration of 3 to 8 minutes or about 6 minutes in ultra-high-purity nitrogen to reactivate any dopants that may have been inadvertently passivated by the hydrogen. After the anneal, the silicon nitride cap is removed by a 3–4 minute soak in a dilute hydrofluoric acid etch. This is followed by a rinse in de-ionized water and then by a brief etch, such as dilute phosphoric acid plus peroxide, to remove the top <30 nanometers of InP surface to remove inadvertent surface damage. After this stage, the sample can now be prepared for contact metallization, anti-reflection coating deposition, or whatever standard process is desired to complete a cell. This process, with only minor adjustments in the optimum conditions as identified above for InP and a 30kHz reactor, is expected to be appropriate for the passivation of any lattice mismatched III-V material or device grown on group IV substrates such as Si or Ge substrates, and hence should be applicable to a wide range of photovoltaic and possibly other optoelectronic device applications.

The novel feature of this process is the focus on eliminating the electrical activity of dislocations rather than solely on the number of such defects. It should be recognized that the essential purpose of reducing the dislocation density is to eliminate any effects the dislocations have on the electronic quality and properties of the semiconductor. The process serves to make the dislocations electrically benign. The hydrogen passivation process is most important for applications where large area heteroepitaxy is desired or required, such as for a photovoltaic cell. In some applications, it may be desirable to combine both approaches.

The passivation of dislocations in heteroepitaxial InP is clearly demonstrated by monitoring deep level or trap concentration resulting from dislocations, and device leakage current. Deep level transient spectroscopy (DLTS) results show that hydrogen passivation reduces the total dislocation-related trap concentration by almost 3 orders of magnitude in InP grown on GaAs (same lattice constant as Ge) test structures, from $\sim 1\times 10^{15}$cm$^{-3}$ to $2-\times 10^{12}$cm$^{-3}$, with a dislocation density of about $1\times 10^8$cm$^{-2}$. This reduction in trap concentration in turn substantially decreases the reverse leakage current, by more than a factor of 25 and as much as 3 orders of magnitude in certain cases. Furthermore, this extreme passivation was found to be unchanged by post passivation annealing up to 550° C. The significance of this latter fact is that all dopants in InP are completely reactivated by a 5 minute anneal at 380° C. with no dislocation reactivation, meaning the original desired doping profile is recoverable but in the absence of dislocation effects. The large decrease in trap concentration is expected to improve the diffusion length in these materials, and the large decrease in reverse bias leakage current signifies a large increase in the shunt resistance across the active junction. Both of these effects are expected to significantly improve final solar cell characteristics.

The process has been optimized for heteroepitaxial InP grown on Ge, Si, or GaAs. The process is also useful for other III-V materials as well, including InGaAs. For instance, the heteroepitaxial material may comprise InGaAs and the corresponding substrate may comprise InP.

EXAMPLE

A hydrogen passivated photovoltaic device was prepared in accordance with the present invention and then analyzed. Specifically, the effects of hydrogenation on the properties of Zn-doped InP/GaAs heterostructures grown by metalloorganic chemical vapor deposition were studied by current-voltage (I-V), deep level transient spectroscopy (DLTS), and photoluminescence (PL). Significant improvements in leakage current and breakdown voltage in InP diodes on GaAs were observed after a two hour hydrogen plasma exposure at 250° C. DLTS indicated a corresponding reduction in total trap concentration from $\sim 6\times 10^{14}$ to $\sim 3\times 10^{12}$ cm$^{-3}$ at a depth of $\sim 1.5$ μm below the surface. The Zn dopants were completely reactivated by a subsequent five minute 400° C. anneal without degradation of the reverse current or reactivation of the deep levels. Anneals in excess of 580° C. were necessary to reactivate the deep levels and degrade the leakage current to their original values, indicating the passivation of threading dislocations by hydrogen, and the existence of a wide temperature window for post-passivation processing.

InP was grown on GaAs substrates by low pressure metalorganic chemical vapor deposition (MOCVD). The InP structure consisted of a 2 μm-thick n$^+$InP layer on n$^+$GaAs substrates. Ohmic contacts were formed by electron beam evaporation and patterning of Au/Zn/Au and Ni/Ge/Au on the p-type InP and n-type GaAs substrate, respectively, followed by a 380° C. anneal in N$_2$. This device structure permitted a probe of the depletion region as measured from the buried junction and up toward the InP surface.

Hydrogenation was performed in a Technics Planar Etch II 30kHz parallel plate plasma reactor. Hydrogen exposure was performed using a 30 sccm flow rate of semiconductor grade H$_2$, chamber pressure of 500 mTorr, power density of 0.08W/cm$^2$, and a substrate temperature of 250° C. Hydrogen exposure time was varied between 45 min. and two hours. Immediately prior to hydrogen exposure, all samples were capped with a thin, hydrogen-permeable, approximately 20 nm layer of SiN$_x$ (wherein x=1–4) to prevent surface degradation by preferential loss of phosphorous during hydrogenation. The nitride layer was etched off in dilute HF before metallization. Current voltage (I-V) and DLTS measurements were performed using an HP 4145 semiconductor parameter analyzer and a Biorad DL4602 DLTS spectrometer, respectively. PL measurements were made using double pass 1m monochrometer and the 488 nm line of an Ar ion laser for excitation.

Figure 3:
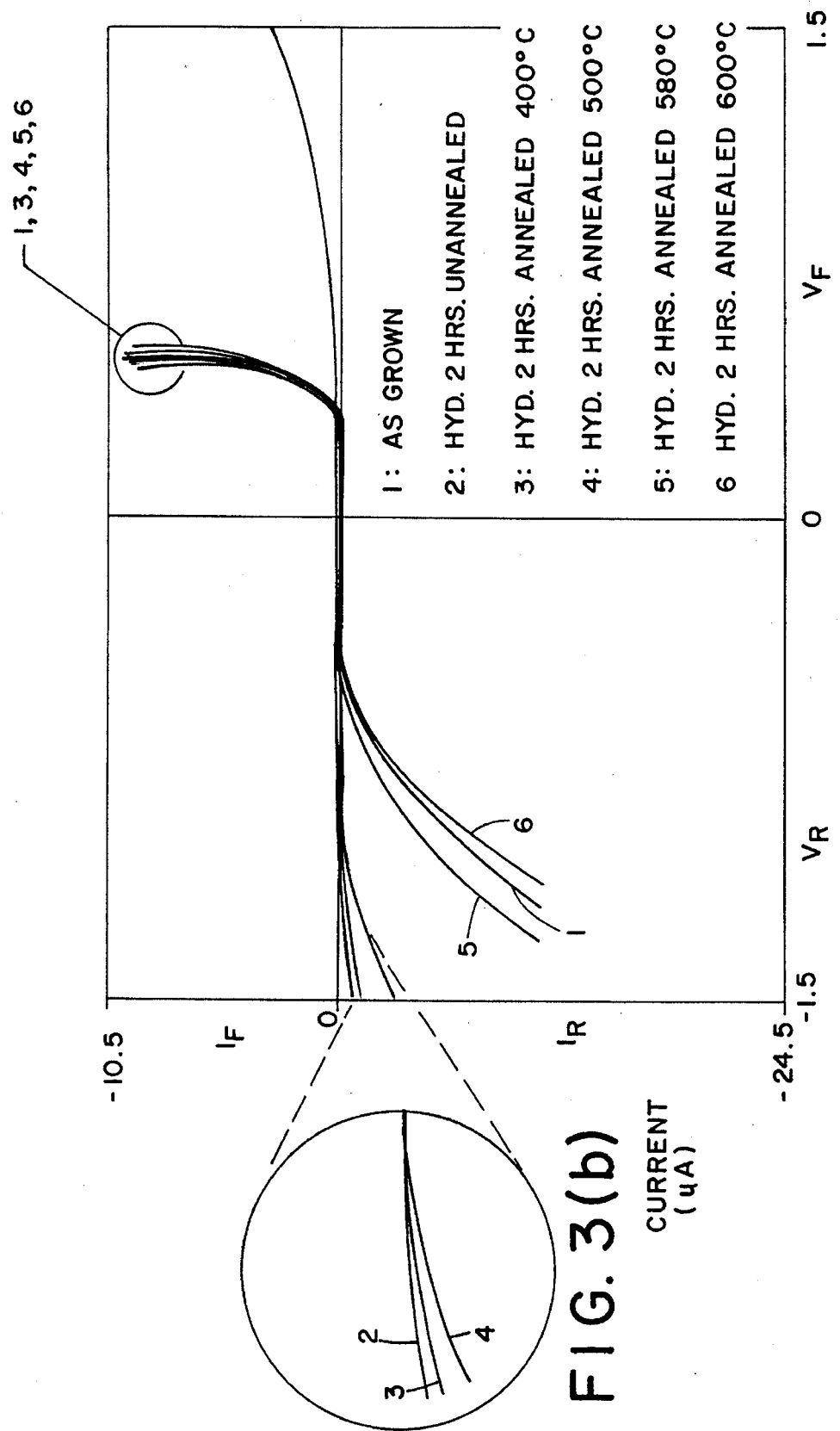
FIG. 3 sets forth current-voltage characteristics of p-InP/n$^+$-InP diodes grown on GaAs, measured at 300K, for the hydrogenation and subsequent annealing conditions shown.
Figure 4:
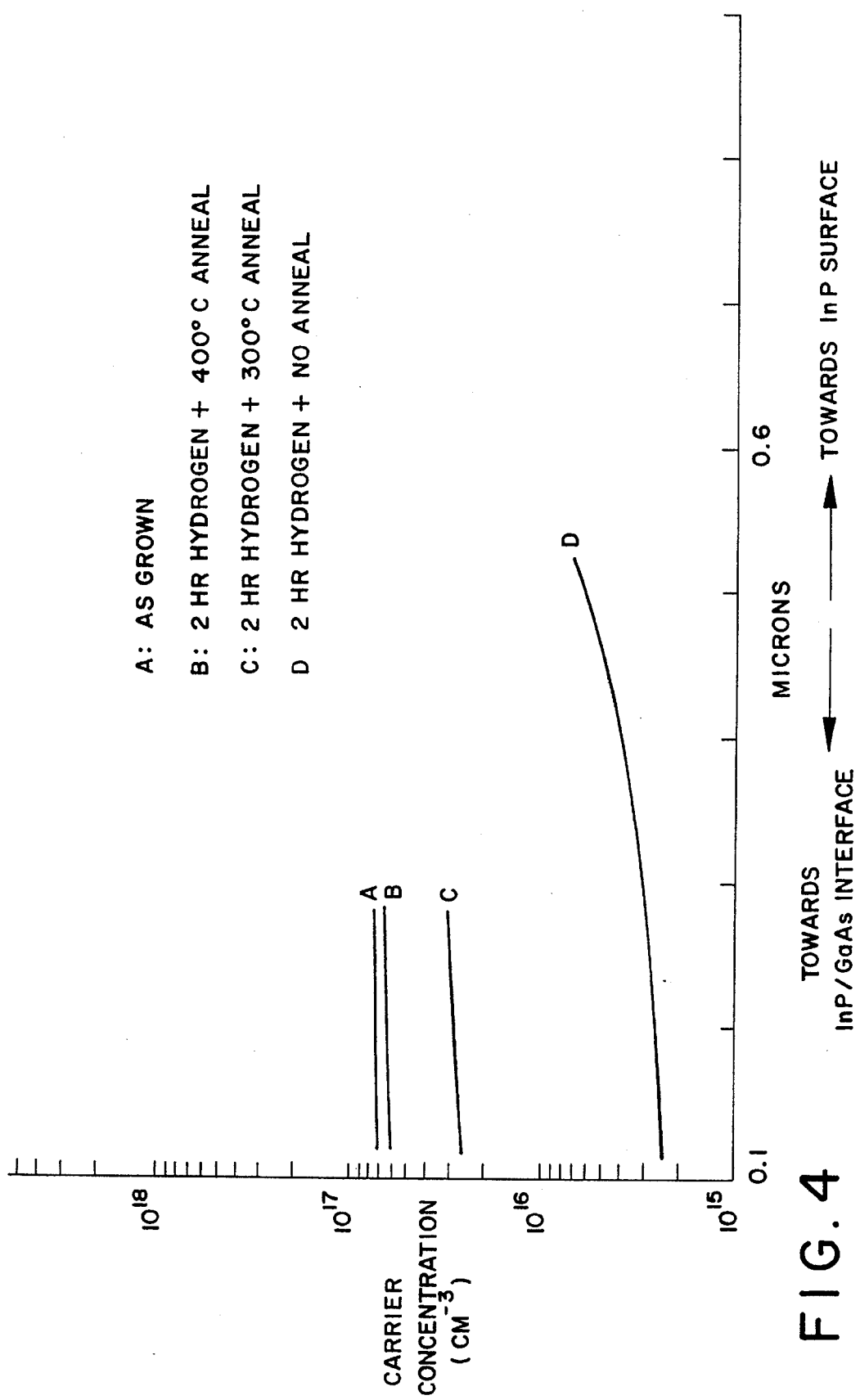
FIG. 4 represents a variation of free carrier concentration with applied reverse bias for heteroepitaxial InP. Carrier concentration data was determined from 1MHz C-V measurements for devices processed as indicated.

Threading dislocations are well known to cause high leakage currents and low reverse bias breakdown in diodes. Such behavior is shown in FIG. 3 which depicts the I-V characteristics of heteroepitaxial InP diodes measured prior to hydrogenation and as a function of hydrogen treatment. A two hour hydrogen exposure substantially increased reverse bias breakdown voltage and decreased reverse leakage current by a factor of ~25 at ~1.5V (curve 2). However, it cannot be concluded from the I-V alone that this improvement results solely from dislocation passivation without first assessing the effects of hydrogen on carrier concentrations, since atomic hydrogen is known to passivate Zn acceptors in InP. The reduction in forward bias current (increase in series resistance) for curve 2 suggests a decrease in carrier concentration in the samples. This was confirmed by C-V profiling. FIG. 4, which indicates that a two hour hydrogen exposure reduces the hole concentration from an as-grown value of $\sim 1 \times 10^{17}$ cm$^{-3}$ to $\sim 2-3 \times 10^{15}$ cm$^{-3}$ at depths greater than 1 µm beneath the InP surface. There is a decrease in carrier concentration deeper within the InP (toward smaller reverse bias) for curve D, which likely results from hydrogen accumulation in the region of higher dislocation concentration closer to the InP/GaAs interface.

An annealing study was undertaken to determine optimum Zn reactivation conditions. A post-hydrogenation anneal for 5 min at 400° C. completely recovered the forward I-V (curve 3 of FIG. 3) which corresponded to complete doping reactivation, as seen in FIG. 4. In FIG. 4, there is a large increase in distance probed for curve D, as the depletion region extends farther away from the buried junction due to the reduction in carrier concentration.

The reverse bias current remained well below the reverse current values prior to hydrogenation, with negligible differences compared to samples hydrogenated with no post-hydrogen anneal. In fact, anneals of 580° C. or higher were necessary to degrade the reverse current to their as-grown values (FIG. 3).

Numerical analysis of the forward I-V characteristics indicated that diode ideality factors ranged from 1.5 to 1.9 for all diodes. The relatively high ideality factors are indicative of generation-recombination centers dominating the current transport characteristics of the InP diodes on GaAs, before and after hydrogen passivation.

Figure 5A:
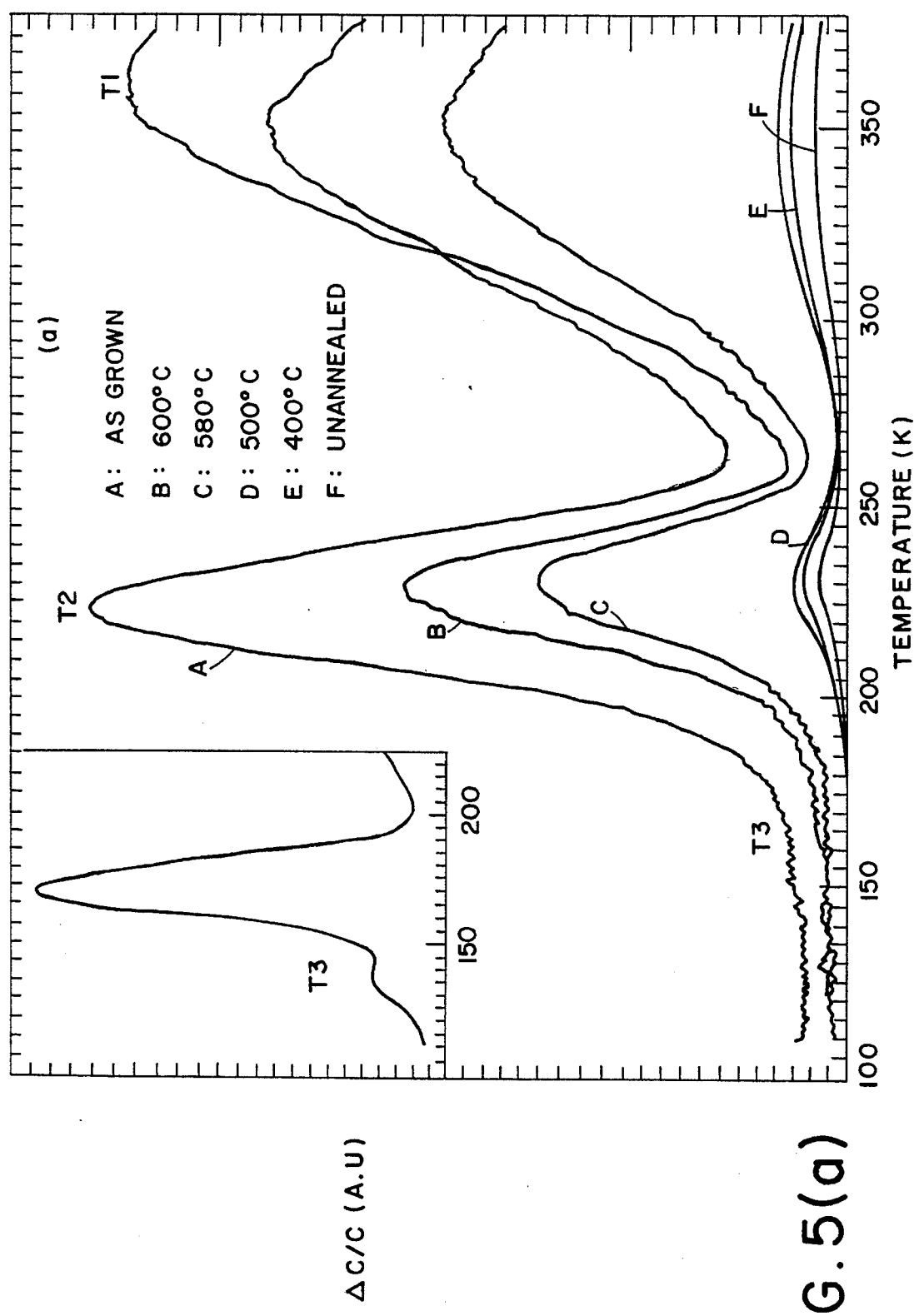
FIG. 5(a) depicts DLTS spectra measured at a rate window of 1000/s for nonhydrogenated InP/GaAs (curve A), and for hydrogenated InP/GaAs as a function of post anneal temperature (curves B-F). The insert contains the DLTS spectra at a rate window of 50/s clearly showing T3 which is not prominent at higher rate windows.

DLTS measurements were performed on these diodes as a function of hydrogen treatment to investigate the presence of transport limiting deep levels and the mechanisms of hydrogen passivation in more detail. FIG. 5(a) shows DLTS spectra measured within the p-InP heteroepitaxial layers as a function of hydrogenation process conditions. Three hold traps, labels T1, T2, and T3 were consistently detected prior to any hydrogen processing. Activation energies with respect to the valence band edge for T1, T2, and T3 were found to be ~0.80, 0.35, and 0.25 eV.

Figure 5B:
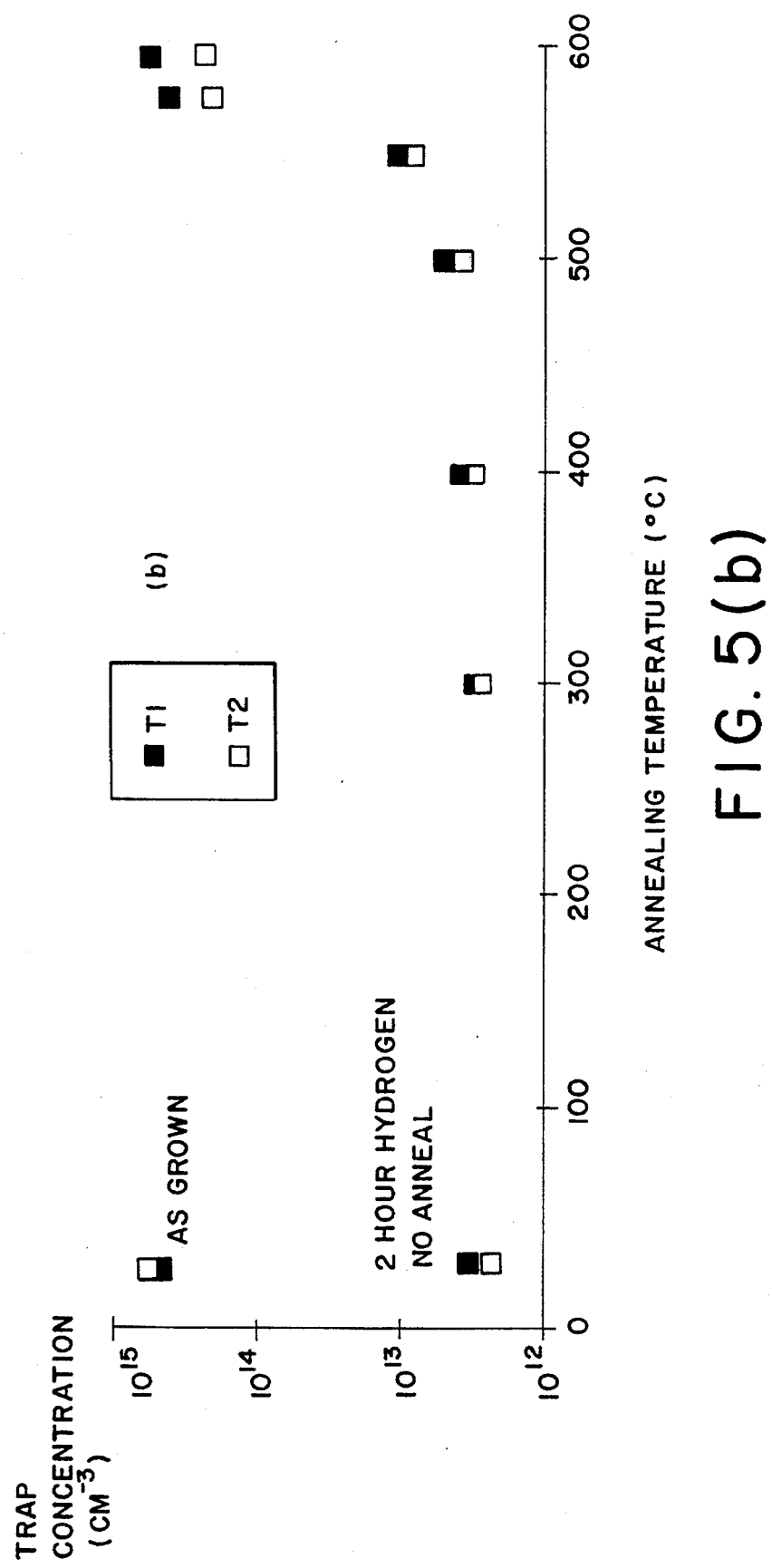
FIG. 5(b) shows a quantitative variation of trap concentration for various hydrogenation and annealing conditions.

As seen from FIGS. 5(a) and 5(b), hydrogenation has a substantial effect on deep level concentration, with a two hour exposure decreasing trap concentrations, by more than two orders of magnitude from their as-grown values. For T1, the measured trap concentration was reduced from $\sim 6 \times 10^{14}$ to $\sim 3 \times 10^{12}$ cm$^{-3}$, indicating very efficient passivation by hydrogen. Similar reduction in trap concentration was found for the T2 level. However, the rate of passivation for T3 was found to be much slower than either T1 or T2, suggesting a different physical source for T3. Using depth-resolved DLTS on nonhydrogenated structures shows that the concentrations of T1 and T2 sharply decreases away from the InP/GaAs interface and toward to InP surface, consistent with the expected behavior of threading dislocation concentration, while the concentration of T3 exhibits no detectable depth dependence. Furthermore, evidence of only T3 was found in Schottky diodes fabricated on homoepitaxial InP/InP grown in the same MOCVD reactor. To further elucidate differences between the deep levels, a study of their relative trapping kinetics found them to be markedly different. T3 tends to saturate for DLTS fill pulse width of <10 µs, whereas both T1 and T2 demonstrate an extended logarithmic dependence on fill pulse time, saturating for pulse widths in excess of 1 ms. T1 and T2 are likely associated with threading dislocations, which are being efficiently passivated by hydrogen, whereas T3 may be related to a point defect inherent to the InP.

The dependence of deep level concentration post-hydrogenation reactivation anneal temperature is also depicted in FIG. 5. Negligible deep level reactivation is observed for a 5 min 400° C. anneal, which was necessary to reactivate the shallow Zn acceptors, shown in FIG. 4. In fact, anneals of 580° C. or more were necessary to fully reactivate the deep levels. The temperature dependence of deep level reactivation closely tracks the leakage current degradation with anneal temperature, shown in FIG. 3, suggesting that hydrogen is passivating the deep levels associated with threading dislocations that are the source of the excess leakage current prior to hydrogenation.

PL measurements further confirm the I-V and DLTS results. FIG. 6 shows PL spectra measured after various process conditions. The peak at 1.39 eV, due to the conduction band to acceptor transition, increases sharply after hydrogenation and remains strong after dopant reactivation anneal. The broad band centered near 1.3 eV is detected for as-grown samples and for hydrogenated samples that have undergone post-hydrogenation anneals in excess of 580° C., indicative of dislocations. Quantitative comparisons can be made by considering the ratio of the bound acceptor peak to the maximum of the broad dislocation band. The ratio increased from ~2 prior to hydrogenation to ~92 after a 2 hour hydrogen exposure, and remained at ~75 after the 400° C. post-hydrogenation dopant reactivation anneal, indicating much improved material quality. The ratio decreased to ~12 after at 600° C. post-hydrogenation anneal, suggesting degradation of material quality consistent with the dissociation of hydrogen-dislocation complexes observed by DLTS and I-V measurements.

The combined I-V, DLTS, and PL results shown here indicate that plasma hydrogenation passivates both Zn acceptors and threading dislocations in heteroepitaxial InP on GaAs. Zn dopants were reactivated by a 5 min 400° C. anneal. Reverse bias leakage currents are strongly suppressed and reverse bias breakdown voltages are substantially increased even after dopant reactivation. DLTS and PL results support the I-V data and show substantially improved material quality after hydrogenation. Annealing temperatures in excess of 580° C. were found necessary to reactivate the dislocations, restore the high leakage current, and reduce the breakdown voltage to their pre-hydrogenation values, indicating that a wide and safe temperature window for post passivation processing exists.

The invention has been described with reference to the preferred embodiment. Obviously modifications and alterations will occur to other upon a reading and understanding of this specification. It is intended to include all such modifications and alterations insofar as they come within the scope of the appended claims or the equivalents thereof.

We claim:

1. A photovoltaic device, comprising:
    a lattice-mismatched substrate; and
    a hydrogen-plasma-passivated heteroepitaxial layer formed of a III-V semiconductor material grown on said substrate.

2. A photovoltaic device, as set forth in claim 1, wherein the lattice-mismatched substrate comprises a group IV material.

3. A photovoltaic device, as set forth in claim 2, wherein the lattice-mismatched substrate comprises Si.

4. A photovoltaic device, as set forth in claim 2, wherein the lattice-mismatched substrate comprises Ge.

5. A photovoltaic device, as set forth in claim 1, wherein the lattice-mismatched substrate comprises GaAs.

6. A photovoltaic device, as set forth in claim 1, wherein the hydrogen-passivated heteroepitaxial layer comprises InP.

7. A photovoltaic device, as set forth in claim 1, wherein the hydrogen-passivated heteroepitaxial layer comprises InGaAs.

8. A photovoltaic devices as set forth in claim 1, wherein the heteroepitaxial layer defines dislocations which have been electrically passivated by plasma hydrogenation.

9. A photovoltaic device, as set forth in claim 1, wherein the photovoltaic device is a solar cell.

10. A photovoltaic cell comprising:
   a lattice-mismatched group IV substrate including an element selected from the group consisting of Ge and Si; and
   a hydrogen-passivated heteroeptiaxial layer of InP grown on the substrate.

11. A process for preparing a hydrogen passivated heteroepitaxial photovoltaic device, comprising the steps of:
   growing a III-V heteroepitaxial material on a lattice mismatched substrate;
   exposing the heteroepitaxial III-V material grown on the lattice mismatched substrate to a plasma of hydrogen at an elevated temperature sufficient to cause diffusion of reactive hydrogen ions into the heteroepitaxial III-V material;
   bonding the reactive hydrogen to dangling bonds along dislocations defined in the heteroepitaxial material;
   reducing electrical activity in the dislocations by hydrogenation;
   producing a hydrogen passivated heteroepitaxial III-V photovoltaic device; and
   reactivating any dopants inadvertently passivated by the hydrogen.

12. A process for preparing a hydrogen passivated heteroepitaxial photovoltaic device, as set forth in claim 11, comprising the additional step of:
   capping the heteroepitaxial material with a thin hydrogen permeable nitride layer prior to the step of exposing.

13. A process for preparing a hydrogen passivated heteroepitaxial photovoltaic device, as set forth in claim 12, comprising the additional step of:
   removing the nitride layer.

14. A process for preparing a hydrogen passivated heteroepitaxial photovoltaic device, as set forth in claim 11, wherein the heteroepitaxial material comprises InP.

15. A process for preparing a hydrogen passivated heteroepitaxial photovoltaic device, as set forth in claim 11, wherein the heteroepitaxial material comprises InGaAs and the substrate comprises InP.

16. A process for preparing a hydrogen passivated heteroepitaxial photovoltaic device, as set forth in claim 11, wherein the substrate comprises a group IV element.

17. A process for preparing a hydrogen passivated heteroepitaxial photovoltaic device, as set forth in claim 16, wherein the substrate comprises Si.

18. A process for preparing a hydrogen passivated heteroepitaxial photovoltaic device, as set forth in claim 16, wherein the substrate comprises Ge.

19. A process for preparing a hydrogen passivated heteroepitaxial photovoltaic device, as set forth in claim 11, wherein the substrate is GaAs.

20. A process for preparing a hydrogen passivated heteroepitaxial photovoltaic device, as set forth in claim 11, wherein the step of reactivating comprises heating a cooled hydrogen passivated heteroepitaxial III-V photovoltaic device to a temperature sufficient to reactivate the dopants.

21. In a photovoltaic device comprising a lattice mismatched substrate and a III-V heteroepitaxial material grown on said substrate, the heteroepitaxial material defining electrically active dislocations therein, the improvement comprising:
   plasma-formed hydrogen bonds in the dislocations defined within the heteroepitaxial material wherein electrical activity in the dislocations is reduced.

22. A process for preparing a hydrogen passivated heteroepitaxial photovoltaic device, comprising the steps of:
   growing heteroepitaxial InP on a lattice mismatched substrate;
   diffusing reactive hydrogen ions from a plasma deep into dislocations defined within the bulk of the heteroepitaxial InP;
   passivating the dislocations by bonding the reactive hydrogen to dangling bonds in the dislocations; and
   reactivating any dopants inadvertently passivated by the hydrogen.

23. A process for preparing a hydrogen passivated heteroepitaxial photovoltaic device, as set forth in claim 22, wherein the heteroepitaxial InP is grown to at least 2 microns in thickness.

* * * * *